(12) United States Patent
Araki et al.

(10) Patent No.: US 8,114,566 B2
(45) Date of Patent: Feb. 14, 2012

(54) PHOTOSENSITIVE RESIN COMPOSITION FOR FLEXOGRAPHIC PRINTING

(75) Inventors: Yoshifumi Araki, Tokyo (JP); Kazuyoshi Yamazawa, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 564 days.

(21) Appl. No.: 12/226,025

(22) PCT Filed: Apr. 5, 2007

(86) PCT No.: PCT/JP2007/057669
§ 371 (c)(1),
(2), (4) Date: Oct. 6, 2008

(87) PCT Pub. No.: WO2007/116941
PCT Pub. Date: Oct. 18, 2007

(65) Prior Publication Data
US 2009/0176176 A1    Jul. 9, 2009

(30) Foreign Application Priority Data
Apr. 7, 2006   (JP) ................................. 2006-106221

(51) Int. Cl.
*G03F 7/004* (2006.01)
*G03F 7/027* (2006.01)
*G03F 7/028* (2006.01)

(52) U.S. Cl. .................. 430/270.1; 430/281.1

(58) Field of Classification Search ............... 430/270.1, 430/281.1, 916, 273.1, 271.1
See application file for complete search history.

(56) References Cited

U.S. PATENT DOCUMENTS

| | | | | |
|---|---|---|---|---|
| 4,045,231 A | * | 8/1977 | Toda et al. ................ | 430/286.1 |
| 4,323,636 A | * | 4/1982 | Chen ........................... | 430/271.1 |
| 4,981,940 A | * | 1/1991 | Konotsune et al. ............ | 528/26 |
| 5,888,697 A | * | 3/1999 | Fan ............................ | 430/273.1 |
| 6,326,126 B1 | | 12/2001 | Gries | |
| 6,344,303 B1 | * | 2/2002 | Takahashi .................... | 430/253 |
| 6,485,812 B1 | * | 11/2002 | Sekiguchi .................. | 428/32.29 |
| 7,901,863 B2 | | 3/2011 | Yamada | |
| 2001/0053437 A1 | * | 12/2001 | Sato et al. ..................... | 428/209 |
| 2005/0239930 A1 | * | 10/2005 | Clair et al. ................... | 524/190 |

FOREIGN PATENT DOCUMENTS

| | | |
|---|---|---|
| JP | 02-108632 | 4/1990 |
| JP | 04-342258 | 11/1992 |
| JP | 06-186740 | 7/1994 |
| JP | 06-186742 | 7/1994 |
| JP | 09-230583 | 9/1997 |
| JP | 2000-155418 | 6/2000 |
| JP | 2000 289180 | 10/2000 |
| JP | 2002-292985 | 10/2002 |
| JP | 2005-084418 | 3/2005 |
| JP | 2006-91490 | 4/2006 |
| WO | WO 2005/064413 A1 | 7/2005 |
| WO | WO 2005/070691 A1 | 8/2005 |
| WO | WO 2005/109101 A1 | 11/2005 |

OTHER PUBLICATIONS

Asahi Glass Company, "no Kagaku Shohin," The Chemical Daily Co. Ltd.; Jan 25, 1989, pp. 1, 691-693, XP002992636.
Shen, Jing Wen, "Studies of the Flexographic Photosensitive Printing Plates Formulation and Platemaking Techniques," Engineering Science and Technology, Jul. 15, 2005.
Chinese Office Action for Corresponding Chinese Application No. 200780012556.0 dated Mar. 10, 2011.

* cited by examiner

*Primary Examiner* — Anca Eoff
(74) *Attorney, Agent, or Firm* — Finnegan, Henderson, Farabow, Garrett & Dunner, L.L.P.

(57) ABSTRACT

There is provided a photosensitive resin composition for a solvent-developing or thermally-developing flexographic printing plate, the photosensitive resin composition comprising: (a) a block copolymer containing a polymer block having conjugated diene as a main component and a polymer block having a vinyl aromatic hydrocarbon as a main component; (b) a photopolymerizable monomer; (c) a photopolymerization initiator; and (d) an organosilicon compound. A photosensitive resin composition for printing in which the organosilicon compound is a silicone oil containing a specific group is preferable, and a photosensitive resin composition for printing in which the organosilicon compound is a silicone oil containing an amino group or an aryl group is most preferable.

10 Claims, No Drawings

PHOTOSENSITIVE RESIN COMPOSITION FOR FLEXOGRAPHIC PRINTING

TECHNICAL FIELD

The present invention relates to a photosensitive resin composition for use in a flexographic printing plate.

BACKGROUND ART

Common photosensitive resin compositions for flexographic printing generally contain a thermoplastic elastomer, a photopolymerizable unsaturated monomer and a photopolymerization initiator.

The construct for the flexographic printing plate includes a polyester film or the like as a support, the photosensitive resin composition provided thereon, and further includes, if required, a protective layer for the purpose of smooth contacting with a negative film provided on the photosensitive resin composition, or an ultraviolet-ray shielding layer which contains an infrared-ray sensitive substance and can be ablated with an infrared laser.

For making the flexographic printing plate from such the photosensitive resin construct for the flexographic printing plate, the whole construct surface is first subjected to ultraviolet-ray exposure (back exposure) through the support to photopolymerize the resin composition to make a uniform thin cured layer. Then, through the negative film or directly from above the ultraviolet-ray shielding layer, the photosensitive resin layer is subjected to image exposure (relief exposure); and unexposed parts are washed away with a developing solvent (hereinafter referred to as solvent development), or the resin layer is brought into contact with an absorbing layer such as a nonwoven fabric which can absorb the unexposed parts heated at 40° C. to 200° C. and the absorbing layer is removed to remove the unexposed parts (hereinafter referred to as thermal development). Thereafter, the resin construct surface on which irregularities are formed is subjected to a post-exposure to make the flexographic printing plate, which is a general manufacturing method thereof.

Printing using the photosensitive resin plate for flexographic printing is performed with a system in which ink is supplied by an ink-supplying roll or the like on convex parts of the printing plate surface on which irregularities have been formed and the resin plate is brought into contact with a matter to be printed to transfer the ink on the surface of the convex parts to the matter to be printed. In such flexographic printing, when printing is continued for a long time, ink sometimes adheres to shoulder parts of convex parts of a printing plate. Further, in some case, the ink intrudes into concave parts of the printing plate (hereinafter referred to as printing plate surface smear); and a pattern is printed up to parts which are not included in an original pattern. In such a case, printing is once suspended and the printing plate surface must be wiped off with a cloth using a washing liquid such as an alcohol, which is economically disadvantageous.

Various methods of suppressing the printing plate surface smear have been proposed.

Patent Document 1 proposes a method in which a mixed liquid of an ink-repellent material and an aqueous resin is applied on a printing plate surface.

Patent Document 2 proposes a method in which a photosensitive resin for flexographic printing is brought into contact with a solution containing a silicon compound or a fluorine compound before the post-exposure process in platemaking of the resin.

Patent Document 3 proposes a method in which a liquid containing a modified-silicone compound or a fluorine compound is brought into contact with a water-developing photosensitive resin plate for letterpress printing after the exposure process in platemaking of the plate.

The techniques of Patent Documents 1 to 3 above necessitate an additional process in which a printing plate surface is brought into contact with an ink-repellent component during the platemaking process or after platemaking. Further, this contacting process sometimes causes variations in the effect of preventing printing plate surface smear, depending on contact time, contact area and the like.

Patent Document 4 proposes a photosensitive resin composition for printing base materials which contains a resin having a molecular weight of not less than 1,000 and not more than 200,000 and having a polymerizable unsaturated group, and an organosilicon compound having a Si—O bond and is capable of being laser engraved. It proposes, as an example, a resin composition containing a liquid resin having a polarity and a molecular weight of 10,000 and containing an organosilicon compound having a Si—O bond. The composition does not necessarily have sufficient transparency and cold flow resistance because it aims at use as printing base materials by laser engraving.

Patent Document 5 proposes a composition containing fluorine, chlorine and silicon and containing a hydrophobic compound copolymerizable with a polymerizable material. However, since the applicable resin is limited to a liquid or pasty resin, the composition has a problem of being inferior in image reproducibility.

Patent Document 1: Japanese Patent Laid-Open No. 2002-292985
Patent Document 2: Japanese Patent Laid-Open No. 2005-84418
Patent Document 3: WO 05/64413
Patent Document 4: WO 05/70691
Patent Document 5: Japanese Patent Laid-Open No. 06-186740

DISCLOSURE OF INVENTION

Problems to be Solved by the Invention

As described above, in the photosensitive resin construct for flexographic printing, since an irregularity shape is fabricated through an exposure (photopolymerization) process and a development process, the transparency of the photosensitive resin composition is important. Further, the photosensitive resin construct for flexographic printing must undergo storage and transportation before the exposure process and the development process after manufacturing. Therefore, even if heat and load are imparted to the construct in stages of storage and transportation, the construct must have a property of maintaining its shape (cold flow resistance). Hence, no method has been proposed, in which an organosilicon compound is added into a photosensitive composition containing a substantially hydrophobic block copolymer. This is because when an organosilicon compound is added to a block copolymer, the copolymer has problems of decreases in transparency and cold flow resistance.

As described above, no photosensitive resin construct which can prevent the printing plate surface smear while maintaining cold flow resistance, transparency and image reproducibility has been obtained.

Accordingly, an object of the present invention is to provide a photosensitive resin composition simultaneously satisfying (1) a high cold flow resistance of the photosensitive resin construct, (2) a high transparency of the photosensitive resin composition, (3) a high image reproducibility of the printing plate, and (4) a high effect of preventing printing plate surface smear of the printing plate.

Means for Solving the Problems

As a result of exhaustive studies to solve the problems described above, the present inventors have found that the problems described above can be solved, without adding any additional process, by making a photosensitive resin composition containing an organosilicon compound, thereby leading to the completion of the present invention.

That is, the present invention is as follows:

1. A photosensitive resin composition for a solvent-developing or thermally-developing flexographic printing plate, comprising:
   (a) a block copolymer comprising a polymer block having a conjugated diene as a main component and a polymer block having a vinyl aromatic hydrocarbon as a main component;
   (b) a photopolymerizable monomer;
   (c) a photopolymerization initiator; and
   (d) an organosilicon compound.
2. The photosensitive resin composition according to above 1, wherein the organosilicon compound (d) comprises a silicone oil having a siloxane unit.
3. The photosensitive resin composition according to above 2, wherein the organosilicon compound (d) comprises an amino group or an aryl group.
4. The photosensitive resin composition according to above 2, wherein the organosilicon compound (d) comprises an aralkyl group.
5. The photosensitive resin composition according to above 2, wherein the organosilicon compound (d) comprises an amino group.
6. The photosensitive resin composition according to above 5, wherein the organosilicon compound (d) has an amino group equivalent of from 300 g/mol to 1,000 g/mol.
7. The photosensitive resin composition in any one of above 1 to 6, wherein the block copolymer (a) comprises a polymer block having butadiene as a main component and a polymer block having a vinyl aromatic hydrocarbon as a main component.
8. The photosensitive resin composition in any one of above 1 to 6, wherein the photosensitive resin composition has a content of the organosilicon compound (d) in a range from 0.05% by weight to 1.0% by weight.
9. The photosensitive resin composition for a solvent-developing or a thermally-developing flexographic printing plate according to any one of above 1 to 7, wherein the composition comprises 69 to 95% by weight of the component (a), 1 to 20% by weight of the component (b), 0.1 to 10% by weight of the component (c) and 0.05 to 1.0% by weight of the component (d) based on 100% by weight of a sum of the components (a), (b), (c) and (d) in the composition.
10. The photosensitive resin composition according to any one of above 1 to 9, wherein the photosensitive resin composition has a vinyl content of not less than 40 mol % based on a total amount of a liquid conjugated diene rubber contained in the composition.
11. The photosensitive resin composition according to any one of above 1 to 9, wherein the photosensitive resin composition comprises a liquid conjugated diene rubber and wherein at least one liquid conjugated diene rubber has a vinyl content of not less than 40 mol %.
12. The photosensitive resin composition according to any one of above 1 to 11, wherein the block copolymer (a) comprises an alkylene unit.
13. The photosensitive-resin composition according to any one of above 1 to 12, wherein at least one block copolymer (a) contained in the photosensitive resin composition has a number-average molecular weight of more than 200,000.
14. The photosensitive resin composition according to any one of above 1 to 13, wherein at least one photopolymerizable monomer (b) comprises 2 mol of a methacrylate group per one molecule and wherein the photosensitive resin composition comprises not less than 2.0% by weight of the photopolymerizable monomer (b).
15. A photosensitive resin construct for a solvent-developing or thermally-developing flexographic printing plate, the construct comprising a laminated structure comprising:
    a support; and
    a layer of the photosensitive resin composition according to any one of above 1 to 14 molded on a surface of the support.
16. The photosensitive resin construct for a solvent-developing or thermally-developing flexographic printing plate according to above 15, the construct comprising on the photosensitive resin composition layer an ultraviolet-ray shielding layer which comprises an infrared-ray sensitive substance and which is able to ablate with an infrared laser.
17. A solvent-developing or thermally-developing flexographic printing plate obtained by a process using the composition or the construct according to any one of above 1 to 16.

ADVANTAGEOUS EFFECTS OF THE INVENTION

The photosensitive resin composition according to the present invention simultaneously satisfies a high preventing effect on the printing plate smear of a printing plate while maintaining a high cold flow resistance of the photosensitive resin construct, a high transparency of the photosensitive resin composition, and a high image reproducibility of the printing plate.

BEST MODE FOR CARRYING OUT THE INVENTION

Hereinafter, the present invention will be described in detail centered on the preferable embodiments.

The photosensitive resin composition according to the present invention comprises: (a) a block copolymer containing a polymer block having a conjugated diene as a main component and a polymer block having a vinyl aromatic hydrocarbon as a main component; (b) a photopolymerizable monomer; (c) a photopolymerization initiator; and (d) an organosilicon compound.

The block copolymer (a) of the present invention must contain at least one polymer block having conjugated diene as a main component and at least one polymer block having a vinyl aromatic hydrocarbon as a main component.

The term "as a main component" used throughout this specification means a content of not less than 60% by weight in a block. Above all, the content is preferably not less than 80% by weight, more preferably 90% by weight.

Examples of the conjugated diene may include monomers such as 1,3-butadiene, isoprene, 2,3-dimethyl-1,3-butadiene, 2-methyl-1,3-pentadiene, 1,3-hexadiene, 4,5-diethyl-1,3-octadiene, 3-butyl-1,3-octadiene and chloroprene. Above all, 1,3-butadiene is preferable in view of wear resistance. These monomers may be used singly or in combination of two or more thereof. The vinyl content in the total butadiene amount in a polymer block having conjugated diene as a main component, for example, the content of 1,2-butadiene and 3,4-isoprene, is not especially limited. The vinyl content is preferably 5 mol % to 50 mol % in view that it provides a high formability of fine images of a printing plate and a high chipping resistance of the printing plate. The content is more preferably in a range from 8 mol % to 50 mol %, still more preferably from 10 mol % to 40 mol %.

The number-average molecular weight of the polymer block having conjugated diene as a main component is preferably from 20,000 to 250,000, because it provides a high cold flow resistance and a high chipping resistance of convex parts of a printing plate. The molecular weight is more preferably from 30,000 to 200,000, still more preferably from 40,000 to 150,000.

For providing a high solvent ink resistance, the block copolymer (a) preferably comprises an alkylene unit. The introducing method of an alkylene unit is not especially limited, but includes a method in which raw material monomers for a block copolymer is polymerized with monoolefins such as ethylene and butylene and a method in which a conjugated diene polymer block is hydrogenated. Above all, hydrogenation of the conjugated diene block polymer is preferable in view of its availability. The content of the alkylene unit in the block copolymer (a) is preferably not less than 5 mol % in view of providing a high solvent ink resistance, and preferably not more than 50 mol % in view of providing a high chipping resistance of convex parts of a printing plate. The content is more preferably in a range from 10 mol % to 35 mol %, still more preferably from 10 mol % to 25 mol %.

Since a high image reproducibility and a higher chipping resistance of convex parts of the printing plate are provided, the alkylene unit described above is preferably contained in the polymer block having butadiene as the main component. More preferably, the polymer block moiety having butadiene as a main component is hydrogenated, and contains all of a 1,4-butadiene unit, a 1,2-butadiene (vinyl) unit and a butylene (alkylene) unit. More preferably, the polymer block having butadiene as the main component contains the 1,4-butadiene unit in a range from 25 mol % to 70 mol %, the 1,2-butadiene (vinyl) unit in a range from 0 mol % to 50 mol % and the butylene unit in a range from 10 mol % to 50 mol %.

The conjugated diene, vinyl contents of the conjugated diene and the contents and ratios of the vinyl aromatic hydrocarbon can be measured using a nuclear magnetic resonance apparatus ($^1$H-NMR).

Examples of the vinyl aromatic hydrocarbon may includes monomers such as styrene, t-butylstyrene, divinylbenzene, 1,1-diphenylstyrene, N,N-dimethyl-p-aminoethylstyrene, N,N-diethyl-p-aminoethylstyrene, vinylpyridine, p-methylstyrene, tertiarybutylstyrene, α-methylstyrene and 1,1-diphenylethylene. Above all, styrene is preferable in view of a photosensitive resin construct capable of being molded smoothly at a relatively low temperature (hereinafter referred to as high moldability). These monomers may be used singly or concurrently in two or more thereof.

The number-average molecular weight of the polymer block having a vinyl aromatic hydrocarbon as a main component is preferably not more than 100,000 in view that fine images can be formed on a printing plate in a high reproducibility, and preferably not less than 3,000 because of the photosensitive resin construct having a high cold flow resistance. The molecular weight is more preferably in a range from 5,000 to 80,000, still more preferably from 5,000 to 60,000.

The content of a vinyl aromatic hydrocarbon in the block copolymer is preferably not more than 25% by weight in view of a high moldability of the photosensitive resin composition, a high chipping resistance of convex parts of a printing plate and a high maintainability of the printing plate hardness when a flexographic ink is adhered to the printing plate. On the other hand, the content is preferably not less than 13% by weight in view of a high cold flow resistance of the photosensitive resin construct. The content is more preferably in a range from 15% by weight to 24% by weight, still more preferably from 16% by weight to 23% by weight.

As required, a block as a third component may be contained.

The number-average molecular weight of at least one block copolymer (a) contained in the photosensitive resin composition is preferably not less than 200,000 because of providing a high cold flow resistance of the photosensitive resin construct and a high chipping resistance of convex parts of a printing plate. The molecular weight is more preferably not less than 230,000.

The content of the block copolymer (a) in the photosensitive resin composition is preferably not less than 69% by weight based on 100% by weight of the sum of the components (a), (b), (c) and (d) in the photosensitive resin composition according to the present invention in view of a high cold flow resistance of the photosensitive resin construct and a high chipping resistance of convex parts of a printing plate, and preferably not more than 95% by weight because of the easy moldability of the photosensitive resin composition. The content is more preferably in a range from 75% by weight to 90% by weight, still more preferably from 80% by weight to 90% by weight.

The photopolymerizable monomer (b) of the present invention may includes esters of acrylic acid, methacrylic acid, fumaric acid and maleic acid; derivatives of acrylamide and methacrylamide; allyl esters, styrene and its derivatives; and N-substituted maleimide compounds.

Specific examples may include diacrylates and dimethacrylates of alkanediols such as hexandiol and nonanediol; diacrylates and dimethacrylates of ethylene glycol, diethylene glycol, propylene glycol, dipropylene glycol, polyethylene glycol and butylene glycol; trimethylolpropane tri(meth)acrylate, dimethyloltricyclodecane di(meth)acrylate, isoboronyl (meth)acrylate, phenoxypolyethylene glycol (meth)acrylate, pentaerythritol tetra(meth)acrylate, N,N'-hexamethylenebisacrylamide and N,N'-hexamethylenebismethacrylamide, styrene, vinyltoluene, divinylbenzene, diacryl phthalate, triallyl cyanurate, fumaric acid diethyl ester, fumaric acid dibutyl ester, dioctyl fumarate ester, fumaric acid distearyl ester, fumaric acid butyl octyl ester, fumaric acid diphenyl ester, fumaric acid dibenzyl ester, maleic acid dibutyl ester, maleic acid dioctyl ester, fumaric acid bis(3-phenylpropyl) ester, fumaric acid dilauryl ester, fumaric acid dibehenyl ester and N-laurylmaleimide. These may be used singly or in combination of two or more thereof.

The content of the phtopolymerizable monomer (b) in the photosensitive resin composition is preferably not less than 1% by weight based on 100% by weight of the sum of the components (a), (b), (c) and (d) in the photosensitive resin composition according to the present invention in view of the high chipping resistance of convex parts of the printing plate, and preferably not more than 20% by weight in view of a high cold flow resistance of the photosensitive resin construct and a high flexibility of the printing plate. The content is preferably in the range from 2% by weight to 15% by weight, still more preferably from 4% by weight to 12% by weight.

In view of the higher chipping resistance of convex parts of the printing plate, the resin composition preferably contains not less than 2.0% by weight of a monomer having 2 mol of a methacrylate group.

The photopolymerization initiator (c) of the present invention is a compound which absorbs the light energy and generates radicals, and well-known various types thereof can be used. Various types of organic carbonyl compounds, especially aromatic carbonyl compounds, are suitable.

Specific examples may include benzophenone, 4,4-bis(diethylamino)benzophenone; t-butylanthraquinone, 2-ethylanthraquinone; thioxanthones such as 2,4-diethylthioxanthone, isopropylthioxanthone and 2,4-dichlorothioxanthone; acetophenones such as diethoxyacetophenone, 2,2-methoxyphenylacetophenone, 2-hydroxy-2-methyl-1-phenylpropane-1-one, benzyl dimethyl ketal, 1-hydroxycyclohexylphenyl ketone, 2-methyl-2-morpholino(4-thiomethylphenyl) propan-1-one and 2-benzyl-2-dimethylamino-1-(4-morpholinophenyl)-butanone; benzoin ethers such as benzoin methyl ether, benzoin ethyl ether, benzoin isopropyl ether and benzoin isobutyl ether; acylphosphine oxides such as 2,4,6-trimethylbenzoyl diphenyl phosphine oxide, bis(2,6-dimethoxybenzoyl)-2,4,4-trimethylpentylphosphine oxide and bis(2,4,6-trimethylbenzoyl)-phenylphosphine oxide; methylbenzoyl formate; 1,7-bisacridinylheptane; and 9-phenylacridine. These may be used singly or in combination of two or more thereof.

The content of the photopolymerization initiator (c) is preferably in a range from 0.1% by weight to 10% by weight based on 100% by weight of the sum of the components (a), (b), (c) and (d) in the photosensitive resin composition according to the present invention in view of a high reproducibility of fine points and characters and the transmittance of active light such as ultraviolet rays being held in a preferable range. The content is more preferably in a range from 0.5% by weight to 5% by weight.

A degradation-type photopolymerization initiator and a hydrogen-abstraction-type photopolymerization initiator may be concurrently used. The amount of the hydrogen-abstraction-type photopolymerization initiator in the photosensitive resin composition is preferably not more than 1.0% by weight because of a high image reproducibility and wear resistance of a printing plate. The amount is more preferably not more than 0.5% by weight.

The organosilicon compound (d), which is essential in the present invention, includes silicone oils containing a siloxane unit (hereinafter, simply referred to as silicone oil) and silane coupling agents, silane compounds, silicone rubbers and silicone resins. Above all, silicone oils are preferable in view that the transparency of the photosensitive resin composition and the cold flow resistance of the photosensitive resin construct can be achieved in a balanced manner.

The molecular structure is not especially limited, but preferable compounds may include those having polyalkylsiloxane such as polydimethylsiloxane and polydiethylsiloxane in their main chain. Compounds having a polysiloxane structure in a part of their molecule may be used. Further, compounds in which a specific organic group is introduced to the polysiloxane structure may be used. Specifically usable are compounds in which organic groups are introduced to side chains of polysiloxane, compounds in which organic groups are introduced to both terminals of polysiloxane, compounds in which an organic group is introduced to one terminal of polysiloxane, compounds in which organic groups are introduced to both side chains and terminals of polysiloxane, and the like.

Specific examples of organic groups introduced into polysiloxane structures may include an amino group, a carboxyl group, a carbinol group, an aryl group, an alkyl group, an alkoxycarbonyl group, an alkoxy group, a linear or branched alkyl group substituted with at least one aryl group and a polyoxyalkylene group.

Among these, organic groups containing at least an amino group or an aryl group are preferable in view of a high transparency and image reproducibility of the photosensitive resin composition.

The amino group may include a primary to tertiary monoamino group or diamino group. The aryl group may include a phenyl group, a tolyl group, a xylyl group, a biphenyl group, a naphthyl group, an anthryl group, a pyrenyl group and a phenanthryl group. A linear or branched alkyl group substituted with, for example, an aryl group such as a methylstyryl group or a styryl group is preferable. Further, an organic group in which a hydrogen atom bonded to an aromatic carbon of an aryl group is substituted with another functional group may be used. Further, an organic group in which a part of or the whole of hydrogen atoms bonded to the organic groups is substituted with halogen atoms such as fluorine atoms, chlorine atoms and bromine atoms may be used.

Above all these, an organic group containing an amino group or an aralkyl group in which at least one hydrogen atom of an alkyl group is substituted with an aryl group is more preferable. Among the aralkyl groups, aralkyl groups having a hydrogen atom bonded to a carbon atom to which a phenyl group is directly bonded, that is, aralkyl groups such as methylstyryl having a hydrogen atom (hereinafter, abbreviated as α-position hydrogen) bonded to the α-position carbon of a straight chain compound are especially preferable in view of a high effect on preventing the printing plate surface smear of the printing plate.

Further, silicone oils having an amino group as the organic group are most preferable because of the high cold flow resistance of the photosensitive resin construct and a long lasting effect of preventing the printing plate surface smear of the printing plate. Among them, the organic group preferably contains an aliphatic amine and the amino group preferably has an amino equivalent weight (g/mol) in a silicone oil in a range from 300 g/mol to 1,000 g/mol because of a high image reproducibility of the printing plate. The amino group equivalent weight is more preferably in a range from 350 g/mol to 800 g/mol. Silicone oils having polysiloxane as a main skeleton and at least an amino group at the terminal are most preferable.

The amino group equivalent weight can be calculated according to the following method. First, about 1 g of a silicone oil containing an aliphatic amine is weighed in a clean Mayer flask (volume: 200 ml); and 50 ml of a mixed solution of isopropyl alcohol and xylene in 1:1 is added thereto. The mixture is fully stirred, and thereafter, the solution is measured using a 0.1-N hydrochloric acid aqueous solution by an automatic titrator. The amino group equivalent weight is calculated by the following equation from the obtained measurement value.

Amino group equivalent weight=(sample amount (g))×10,000)/(hydrochloric acid titration amount (ml)×titer)

The structure and composition of polysiloxane can be measured by $^1$H-NMR or 29Si-NMR. The measurement condition of $^1$H-NMR is as follows. JNM-LA400 (trade name, made by JEOL Ltd.) was used as a measurement instrument of $^1$H-NMR; deuterated chloroform was used as a solvent; the sample concentration was 50 mg/ml; the observing frequency was 400 MHz; the chemical shift was based on TMS (tetramethylsilane); the pulse delay was 2.904 sec; the number of times of the scan was 64; the pulse width was 45°; and the measurement temperature was 26° C.

The condition of 29Si—NMR is as follows. JNM-LA400 (trade name, made by JEOL Ltd.) was uses as a measurement instrument of 29Si—NMR; the observed nucleus was 29Si; the observing frequency was 79.4 MHz; the pulse width was 45°; and the integrating times was 6,000. Tris(2,4-pentanedionate)chromium(III)) was used as a relaxation reagent.

Commonly available commercial silicone oils may include, for example, various types of organic group-substituted silicone oils made by Shin-Etsu Chemical Co., Ltd., Wacker Asahikasei Silicone Co., Ltd., GE Toshiba Silicones Co., Ltd., and Dow Corning Toray Silicone, Inc.

The number-average molecular weight of the organosilicon compound (d) is preferably not more than 15,000 because of the high transparency of the photosensitive resin composition and the high image reproducibility of the printing plate. The molecular weight is more preferably not more than 10,000, still more preferably 3,000.

The content of the organosilicon compound (d) in the photosensitive resin composition according to the present invention is preferably not more than 1.0% by weight based on 100% by weight of the sum of the components (a), (b), (c) and (d) in the photosensitive resin composition according to the present invention because of the high transparency of the photosensitive resin composition and the high image reproducibility of the printing plate. On the other hand, the content is preferably not less than 0.05% by weight because of the high effect of preventing the printing plate surface smear of the printing plate. The content is more preferably from 0.1% by weight to 0.8% by weight, still more preferably in a range from 0.15% by weight to 0.6% by weight.

The organosilicon compound (d) of the present invention is useful in the photosensitive resin construct having an ultraviolet-ray shielding layer. Since the photosensitive resin construct having an ultraviolet-ray shielding layer is largely susceptible to the oxygen inhibition in an exposure process of a resin component unlike the general photosensitive resin construct using a negative film, the curing of the printing plate surface is liable to become incomplete. On the other hand, in the photosensitive resin composition containing an organosilicon compound, since ink-repellent components are easily removed on development, the composition has a high effect of preventing the printing plate surface smear of the printing plate, which can therefore solve the above-mentioned problem.

To the photosensitive resin composition according to the present invention, in addition to the above-mentioned essential components, various types of auxiliary additives may be added, such as plasticizers, thermal polymerization inhibitors, ultraviolet absorbents, halation preventing agents, light stabilizers and light luminescence tags (substances excited by an external energy source and emitting the obtained energy in a form of light and/or radiation).

The plasicizers may include hydrocarbon oils such as naphthene oils and paraffin oils; conjugated diene rubbers having liquid diene as a main component, such as liquid acrylicnitrile-butadiene copolymers and liquid styrene-butadiene copolymers; and polystyrenes having a number-average molecular weight of not more than 2,000, sebacic acid ester and phthalic ester. A photopolymerizable reaction group may be imparted to these plasticizers.

Above all these, conjugated diene rubbers having a viscosity of not more than 2,000 Pa·s at 30° C., namely having a liquid diene as a main component, is preferable in view of the high flexibility and the high image reproducibility of the printing plate. The viscosity can be measured according to JIS K7117.

As the dienes, isoprene and/or butadiene is (are) preferable because of their easy availability, and butadiene is more preferable because of providing the high chipping resistance. The diene rubbers having a viscosity of not more than 2,000 Pa·s at 30° C. and a liquid diene as a main component may be used concurrently in two or more thereof.

The vinyl content based on the total amount of diene contained in at least one conjugated diene rubber having a viscosity of not more than 2,000 Pa·s at 30° C. is preferably not less than 40 mol % because of providing the high reproducibility of fine images and the high chipping resistance. The content is more preferably not less than 60 mol %, still more preferably not less than 80 mol %. The vinyl content in the conjugated diene having a viscosity of not more than 2,000 Pa·s at 30° C. can be measured by $^1$H-NMR (nuclear magnetic resonance spectrum) described above.

The vinyl content based on the total amount of diene in the conjugated diene rubber having a viscosity of not more than 2,000 Pa·s at 30° C. is preferably not less than 40 mol % because of the high reproducibility of fine images, the high chipping resistance of convex parts of the printing plate and a high ink resistance. The content is more preferably not less than 60 mol %, still more preferably not less than 70 mol %.

A lower number-average molecular weight (Mn) of the conjugated diene rubber is more preferable in view of the handleability and the compatibility with the photosensitive resin composition. On the other hand, a higher one is more preferable because of the high chipping resistance. The molecular weight is preferably in a range from 1,000 to 50,000, more preferably from 2,000 to 30,000, still more preferably from 3,000 to 20,000.

The number-average molecular weight (Mn) in the present invention is a molecular weight in terms of polystyrene measured by gel permeation chromatography (GPC). The measurement was performed using LC-10 (trade name, made by Shimadzu Corp.) as the measurement instrument and two columns of TSKgelGMHXL (4.6 mmID×30 cm) as the column, at an oven temperature of 40° C., and using tetrahydrofuran (1.0 ml/min) as the solvent.

Hereinafter, a method for fabricating a construct using the photosensitive resin composition for flexographic printing according to the present invention will be described.

The photosensitive resin construct for flexographic printing generally has a supporting layer, and at least one layer of a photosensitive resin layer thereon, and as required, a protecting layer, an ultraviolet-ray shielding layer which can be cut away with an infrared laser, or the like thereon.

The support may includes, for example, polypropylene films, polyethylene films, polyester films such as polyethylene terephthalate and polyethylene naphthalate, and polyamide films. Size-stable polyester films having a thickness in a range from 75 to 300 μm are preferable. An adhesive layer is preferably provided on the support. The adhesive layer may include, for example, compositions having a binder polymer such as a thermoplastic elastomer, and an adhesive active component such as an isocyanate compound or an ethylenic unsaturated compound. To the adhesive layer, various types of auxiliary additives may be further added, such as plasticizers, thermal polymerization inhibitors, ultraviolet-ray absorbents, halation preventing agents, light stabilizers, photopolymerization initiators, photopolymerizable monomers and dyes. For providing a more adhesive force between the adhesive layer and the support, at least one layer of an underlying layer is more preferably provided.

Since the photosensitive resin composition generally has tackiness, a solvent-soluble protecting layer may be provided on the resin layer surface for improving the contactability with a negative film superposed on the composition in plate making, or for enabling the reuse of the negative film. The protecting layer must, for example, be composed of a substance soluble in a solvent used as a washout liquid, be thin, and have a flexibility. The examples may include a crystalline 1,2-polybutadiene, a soluble polyamide, a partially saponified polyvinyl acetate and a cellulose ester. Above all, the soluble polyamide is preferable. These substances may be dissolved in an appropriate solvent and coated directly on the photosensitive resin layer surface, or may be once coated on a film such as a polyester or polypropylene film, and laminated and transferred together with the film on the photosensitive resin layer.

By making this protecting layer of an ultraviolet-ray shielding layer containing an infrared-ray sensitive substance and directly cutting away the layer by an infrared-ray laser (hereinafter referred to as laser drawing), the layer itself may be used as a negative. In either case, when unexposed parts are washed out after the completion of the exposure, the protecting layer is simultaneously removed. The ultraviolet-ray shielding layer comprises a binder polymer, an infrared-ray sensitive substance and a non-infrared radiation shielding substance. The binder polymer may include, for example, polyamides, polyesters and copolymers composed of a monovinyl-substituted aromatic hydrocarbon and a conjugated diene. Above all, copolymers composed of a monovinyl-substituted aromatic hydrocarbon such as styrene, α-methylstyrene or vinyltoluene and a conjugated diene such as 1,3-butadiene or isoprene are preferable. In the case where a non-infrared radiation shielding layer is constituted using the binder polymer, the layer has a high affinity for the photosensitive resin composition and a favorable adhesiveness.

In the case of using polyester as the binder polymer, the number-average molecular weight thereof is preferably not less than 300 and not more than 10,000.

Examples of especially preferable polyesters may include those synthesized from an alkane diol and adipic acid, those synthesized from an alkane diol and phthalic acid, polycaprolactones and combinations of two or more of these polyesters. The polyester may contain various functional groups such as an amino group, a nitro group, a sulfonic acid group and a halogen in a range of not damaging the compatibility with the binder polymer.

For the infrared-ray sensitive substance, a single substance or a compound having a strong absorption in a range of 750 to 2,000 nm is commonly used. Such an example may include inorganic pigments such as carbon black, graphite, copper chromite and chrome oxide, and dyes such as polyphthalocyanine compounds, cyanine dyes and metal thiolate dyes. These infrared-ray sensitive substances are added in a range of imparting the sensitivity capable of cutting away the protecting layer with a laser beam. The addition of 10 to 80% by weight is generally effective. For the shielding substance of a non-infrared radiation, a substance which reflects or absorbs the radiation such as ultraviolet rays can be used. Absorbents of radiation such as ultraviolet rays, carbon black and graphite are preferable examples and the addition amount is set so as to achieve a predetermined optical density. The addition is generally needed such that the optical density is not less than 2, preferably not less than 3.

An infrared-ray laser of 750 to 2,000 nm in wavelength can be used. This type of infrared-ray laser generally may include a semiconductor laser of from 750 to 880 nm and a Nd-YAG laser of 1,060 nm.

The resin construct for the flexographic printing plate according to the present invention can be prepared by any of various methods. For example, there are the following methods. A method may involve dissolving and mixing raw materials of the photosensitive resin composition in an appropriate solvent such as chloroform, tetrachloroethylene, methyl ethyl ketone or toluene, casting the solution into a mold and evaporating the solvent to make a plate-like construct. A method may involve, without using any solvent, kneading the mixture in a kneader, roll mill or screw extruder, and then molding it into a predetermined thickness by a calendar roll or press. However, the present invention is not limited to these preparation methods.

For providing the protecting layer or the ultraviolet-ray shielding layer on the surface of the photosensitive resin layer, raw materials thereof may be dissolved or dispersed in an appropriate solvent with forced stirring by stirring blades or ultrasonic stirring; or the raw materials are pre-kneaded using an extruder or kneader and then dispersed or dissolved in an appropriate solvent, and the dispersion or solution may be coated directly on the photosensitive resin layer. Further, a cover sheet composed of polyester, polypropylene or the like may be provided on the protecting layer or the ultraviolet-ray shielding layer. Alternatively, a solution for the protecting layer or the ultraviolet-ray shielding layer is coated on a cover sheet to make a protecting film, and then the protecting film may be laminated or pressed on the photosensitive layer to transfer the protecting film.

The protecting film and the support are typically adhered to the photosensitive resin composition by roll lamination after a sheet of the photosensitive resin composition is molded, and heat-pressed after the lamination, thereby providing a photosensitive resin layer with a higher thickness precision.

For making the flexographic printing plate from the photosensitive resin construct for the flexographic printing plate, the following method is generally employed. First, the whole surface of the construct is subjected to ultraviolet-ray exposure through the support of the construct (back exposure), and the photosensitive resin composition is cured to make a uniform thin cured layer. Then, a negative film is laid on the photosensitive resin composition layer; and the photosensitive resin layer surface is subjected to image exposure (relief exposure) through the negative film laid on the photosensitive resin composition layer, or directly from above an ultraviolet-ray shielding layer after the shielding layer provided on the photosensitive resin composition layer is subjected to laser drawing. Then, unexposed parts are washed out with a developing solvent, or unexposed parts heated at 40° C. to 200° C. are brought into contact with an absorbing layer capable of absorbing the unexposed parts and the absorbing layer is removed to remove the unexposed parts. Thereafter, the photosensitive resin layer is subjected to post-exposure to manufacture the flexographic printing plate.

Either of the exposure (relief exposure) from the negative film side or ultraviolet-ray shielding layer side and the exposure from the support side (back exposure) may be first performed, or both may be simultaneously performed. Exposure light sources may include a high pressure mercury lamp, an ultraviolet fluorescent lamp, a carbon arc lamp and a xenon lamp.

The developing solvents used for developing unexposed parts with a solvent may include esters such as heptyl acetate and 3-methoxybutyl acetate; hydrocarbons such as petroleum fractions, toluene and decalin; mixtures of a chlorine-based organic solvent such as tetrachloroethylene with alcohols such as propanol, butanol, and pentanol. Washout of unexposed parts is performed using injection from a nozzle or brushing by a brush.

The absorbing layer of thermal development may include nonwoven materials, paper stocks, fibrous tissues, open-cell foams and porous materials. Preferable examples of the absorbing layers may include nonwoven materials composed of nylon, polyester, polypropylene and polyethylene, and combinations of these nonwoven materials. The especially preferable examples of the absorbing layer may include a nonwoven continuous web of nylon or polyester.

The post-exposure generally uses a method in which light of not more than 300 nm in wavelength is irradiated to the surface. As required, light of more than 300 nm may also be concurrently used.

The flexographic printing plate is brought into contact with a matter to be printed on a printing machine during printing, and too flexible a printing plate cannot provide a finely printed matter due to deformation by compression; and too hard one cannot provide a printed matter having a uniform solid surface; therefore, the Shore A hardness of the printing plate of 3 mm in thickness is preferably in a range from 50° to 68°. This hardness can be achieved, for example, by adjusting the amounts of a block copolymer (a), a phtopolymerizable monomer (b), and as required, a plasticizer and the like.

The resin composition according to the present invention is useful for both the solvent development and the thermal development, but is suitably usable for the solvent development especially in view of the high image reproducibility of the printing plate.

EXAMPLES

Hereinafter, the present invention will be described more specifically by way of examples and comparative examples, but the scope of the present invention is not limited to these examples.

(1) Manufacture of a Block Copolymer (a)

The interior of a 10-L stainless steel-made reactor vessel with a jacket and a stirrer was replaced fully by nitrogen; thereafter, 7,000 cc of cyclohexane, 1 g of tetrahydrofuran, 3.5 g of N,N,N',N'-tetramethylethylenediamine and 170 g of styrene were charged thereto. Warm water was passes through the jacket and the temperature of the contents were set at about 70° C. Thereafter, n-butyllithium cyclohexane solution (net 1.15 g) was added thereto and polymerization of styrene was started. After styrene had been completely polymerized, 830 g of butadiene (1,3-butadiene) was added thereto and the polymerization was continued. At 4 min after the polymerization of butadiene had been completely finished, 0.83 g of tetramethoxysilane was added for the coupling reaction. A part of the obtained block copolymer solution was sampled and thereafter, the solvent was removed by heating. The polymer had a styrene content of 17% by weight, and a 1,2-vinyl content in the butadiene polymer block of 55 mol %. The number-average molecular weight was 240,000. The styrene content was measured using ultraviolet spectroscopy (UV). The vinyl content was measured using infrared spectroscopy (IR), and calculated by the Hampton method. The number-average molecular weight was a molecular weight in terms of polystyrene measured by gel permeation chromatography (GPC). The measurement was performed using LC-10 (trade name, made by Shimadzu Corp.) as the measurement instrument, two columns of TSKgelGMHXL (4.6 mmID×30 cm) as the column and tetrahydrofuran (1.0 ml/min) as the solvent, and at an oven temperature of 40° C.

Next, using the block copolymer solution from which the solvent had been removed, the hydrogenation was performed at a temperature of 70° C. with bis(cyclopentadienyl)titanium chloride and n-butyllithium as hydrogenation catalysts. The hydrogenation rate was controlled by measuring a supplied hydrogen gas amount by a flow meter and stopping the gas supply at the time when the target hydrogenation rate had been attained. Thereafter, 10 g of water was added and the mixture was stirred, and then, 3.0 g of n-octadecyl-3-(3',5'-di-tert-butyl-4'-hydroxyphenyl)propionate and 1.5 g of 2,4-bis(n-octylthiomethyl)-O-cresol were added. The obtained solution was subjected to steam stripping to remove the solvent to thereby obtain a hydrous crumb. Successively, the hydrous crumb was dehydrated and dried by a hot roll to thereby obtain a sample of a block copolymer containing 45 mol % of a 1,4-butadiene unit, 35 mol % of the 1,2-vinyl content and 20 mol % of a butylene unit in the butadiene polymer block. This sample was referred to as Sample (a). The hydrogenation rate was confirmed using a nucleus magnetic resonance apparatus (NMR).

(2) Organosilicon Compounds (d)

For Examples 1 to 9, the following seven types of silicone oils were used.

KF-8010 (trade name, made by Shin-Etsu Chemical Co., number-average molecular weight: not more than 1,000, amino group equivalent: 450 g/mol, and organic groups having an amino group are introduced to both terminals of a polysiloxane.)

X-22-161B (trade name, made by Shin-Etsu Chemical Co., number-average molecular weight: 3,000, amino group equivalent: 1,500 g/mol, and organic groups having an amino group are introduced to both terminals of a polysiloxane.)

KF-410 (trade name, made by Shin-Etsu Chemical Co., Ltd., number-average molecular weight: 8,000, and organic groups having a methylstyryl group are introduced to the side chains of a polysiloxane)

SH-710 (trade name, made by Dow Corning Toray Silicone Co., Ltd., number-average molecular weight: 1,000, and phenyl groups are introduced to the side chains of a polysiloxane.)

X-22-4272 (trade name, made by Shin-Etsu Chemical Co., Ltd., number-average molecular weight: 2,240, and ether groups are introduced to both terminals of a polysiloxane.)

X-22-3710 (trade name, made by Shin-Etsu Chemical Co., Ltd., number-average molecular weight: 1,450, and carboxyl groups are introduced to the terminals of a polysiloxane.)

KF-96-100CS (trade name, made by Shin-Etsu Chemical Co., Ltd., number-average molecular weight: 3,130, and not-modified dimethylpolysiloxane)

(3) Manufacture of Photosensitive Resin Compositions and Photosensitive Resin Constructs.

Photosensitive resin compositions were obtained by charging raw materials, so as to make the compositions shown in Examples 1 to 9 and Comparative Examples 1 to 3, in a kneader whose interior atmosphere was replaced by nitrogen, and mixing the each mixture at 140° C. for 40 min.

A solution for an adhesive layer to be coated on a support was prepared as a solution of 25% in solid content by dissolving, in toluene, 55 parts by mass of Tufprene 912, which is a block copolymer of styrene and 1,3-butadiene, (trade name, made by Asahi Kasei Chemicals Corp.), 38 parts by mass of a paraffin oil (its average carbon number: 33, its average molecular weight: 470, its density at 15° C.: 0.868), 2.5 parts by mass of 1,9-nonanediol diacrylate, 1.5 parts by mass of 2,2-dimethoxy-phenylacetophenone, 3 parts by mass of Epoxy Ester 3000M (trade name, made by Kyoueisha Chemical Co., Ltd.), and 1.5 parts by mass of VALIFAST YELLOW 3150 (trade name, made by Orient Chemical Industries, Ltd.), in proportion. Thereafter, the solution was applied on one surface of a polyester film of 100 μm in thickness using a knife coater so as to have an ultraviolet-ray transmittance of 10%, and dried at 80° C. for 1 min to thereby obtain a support having an adhesive layer. The UV transmittance of the support was obtained by using an ultraviolet-ray exposure machine AFP-1500 (trade name, made by Asahi Kasei Chemicals Corp.) and measuring the transmission intensity by a UV luminometer MO-2 (trade name, made by ORC Manufacturing Co., Ltd., using UV-35 filter), and calculating the transmittance.

Then, a manufacturing method of a protecting film will be described. 65% by weight of Asaflex 810, which is a block copolymer of styrene and 1,3-butadiene, (trade name, made by Asahi Kasei Chemicals Corp.) and 35% by weight of a carbon black as an infrared-ray sensitive substance were kneaded by a kneader, and cut into pellets; thereafter, 90 parts by mass of the pellet and 10% by mass of 1,6-hexanediol adipate were dissolved in a mixed solvent of ethyl acetate/butyl acetate/propylene glycol monomethyl ether acetate prepared in a weight ratio of 50/30/20 utilizing ultrasonic to thereby prepare a homogeneous solution of 12% by weight in solid content. Then, the solution was applied on a polyester film serving as a cover sheet of 100 μm in thickness using a knife coater such that the coated amount after drying was 4 to 5 $g/m^2$, and dried at 80° C. for 1 min to thereby obtain a protecting film having an ultraviolet-ray shielding layer capable of being ablated with infrared rays. The optical density of the protecting film was measured by DM-500 (trade name, made by Dainippon Screen Mfg. Co., Ltd.), and was 3 to 4. The photosensitive resin composition was interposed and laminated between the surface of the obtained support on which the adhesive had been coated and the surface of the protecting film on which the ultraviolet-ray shielding layer had been coated, then pressed, using a spacer of 3 mm, at 130° C. for 4 min under a pressure of 200 $kg/cm^2$ by a heating press, and then cooled to thereby obtain a photosensitive resin construct of 25 cm long×25 cm wide×3 mm thick.

(4) Manufacture of a Flexographic Printing Plate

The cover sheet of the photosensitive resin construct obtained in (3) was peeled off, and loaded on a drum on CDI-classic (trade name, made by Esko-Graphics; Nd-YAG laser of 1,060 nm) with the ultraviolet-ray shielding layer on the photosensitive resin layer being put outside. The ultraviolet-ray shielding layer on the photosensitive resin construct was subjected to laser drawing at a laser power of 20 W and at a drum rotating frequency of 1,600 rpm. The pattern of the laser drawing used a resolution of 2,800 dpi, a screen line number of 59 (line/cm), halftones of 1%, 2%, 3%, 5%, 10%, 30%, 50%, 60%, 70%, 80%, 90%, 95%, and 100% (hereinafter referred to as solid), and concave lines/convex lines of 500 μm in width. Next, the photosensitive resin construct was laid on a glass plate of AFP-1500 exposure machine (trade name, made by Asahi Kasei Chemicals Corp.) with the laser-drawn ultraviolet-ray shielding layer directed upward; and using an ultraviolet fluorescent lamp having a center wavelength of 370 nm, the whole surface was subjected to exposure at 300 to 600 $mJ/cm^2$, first, from the support side such that the relief depth of the printing plate became 0.6 mm. Thereafter, the photosensitive resin construct was subjected to relief exposure at 8,000 $mJ/cm^2$ from above the ultraviolet-ray shielding layer after the drawing. The exposure intensity at this time was measured using a UV luminometer MO-2 (made by ORC Manufacturing Co., Ltd.) and a UV-35 filter; and the intensity obtained by the measurement on a glass plate of ultraviolet rays from the underside lamp, which is on the back exposure side, was 10.3 $mW/cm^2$ and the intensity obtained by the measurement of ultraviolet rays from the upside lamp, which is on the relief exposure side, was 12.5 $mW/cm^2$.

Then, the plate construct was adhered on a cylinder of AFP-1500 developing machine (trade name, made by Asahi Kasei chemicals Corp.) with a double-sided adhesive tape, and subjected to development at a liquid temperature of 25° C. for 5 min using 3-methoxybutyl acetate as a developing liquid. Further, the construct was dried at 60° C. for 2 hours. Thereafter, the whole plate surface was subjected to exposure as post-exposure at 2,000 $mJ/cm^2$ using a germicidal lamp having a central wavelength of 254 nm, and successively subjected to exposure as the post-exposure at 1,000 $mJ/cm^2$ using an ultraviolet fluorescent lamp to thereby obtain a flexographic printing plate. Here, the post-exposure amount by the germicidal lamp was calculated from illuminance measured using an UV-25 filter of the MO-2 luminometer.

(5) Evaluation Methods (5-1) Cold Flow Resistance

The photosensitive resin construct of 3 mm in thickness obtained in. (3) was cut out into 5 cm×5 cm; the thickness change after the cut-out piece was allowed to stand at 40° C. for 7 days with the whole surface of the cut-out piece loaded with a load of 28 $g/cm^2$ was measured. In the case where the thickness reduction rate of the photosensitive resin construct in this measurement exceeded 3.0%, since the plate construct sometimes deformed when the photosensitive resin construct was stored or transported, the photosensitive resin construct was defined as poor; in the case of not less than 2.0% and less than 3.0%, the construct was defined as good; and in the case of less than 2.0%, the construct was most favorable and defined as excellent.

(5-2) Transparency of the Photosensitive Resin Composition

The photosensitive resin component obtained in (3) was interposed by polyester films of 100 μm, and was subjected to a pressure by a press at 200 kg/cm at 130° C. for 4 min, using a spacer, to thereby obtain a construct of 3 mm in thickness. The haze of the construct was measured using a visible-light haze meter 1001DP (trade name, made by Nippon Denshoku Industries Co., Ltd.). A lower haze is preferable for excellent printing quality. Making the haze not more than 20% is important and any construct exceeding 20% was not evaluated for other evaluation items and the construct was not employed as Examples.

(5-3) Image Reproducibility (Depth of Concave Line of 500 μm)

The printing plate obtained in (4) was measured for depth of concave lines of 500 μm in width. A deeper depth of the concave lines is preferable for maintaining excellent printing quality for a long time. The depth of not less than 150 μm was defined as acceptable.

(5-4) Preventing Effect of Printing Plate Surface Smear of the Printing Plate

The printing plate obtained in (4) was evaluated for the preventing effect of the printing plate surface smear of the printing plate by the following three methods.

(5-4-1) Contact Angle of Water Droplet on the Printing Plate Surface

The contact angle of water droplet on the solid surface obtained in (4) was measured by a droplet method using a solid liquid interface analyzer DropMaster 500 (trade name, made by Kyowa Interface Science Co., Ltd.). The printing plate was allowed to stand for 1 day in a thermohygrostat chamber set at a temperature of 23° C. and a relative humidity of 50%. Thereafter, using "FAMAS ver. 1.8.1" as an analysis software, purified water as a probe solution and a stainless steal-made needle 22G as a needle, and under the conditions of a discharge time of 200 ms and a discharge voltage of 4,000 mV, the contact angle at 15 sec after the purified water contacted with the plate was automatically measured. A higher contact angle indicates a higher ink repellency.

(5-4-2) Contact Angle of Water Droplet of the Printing Plate Surface After Wiped with Ethanol The following measurement was conducted as an index of sustainability of preventing the printing plate surface smear. First, the printing plate obtained in (4) was put in a thermohygrostat chamber set at a temperature of 23° C. and a relative humidity of 50%; and the solid surface was rubbed right and left for 10 sec with a nonwoven fabric impregnated with ethanol. At 20 sec after the rubbing finished, the contact angle of the surface was measured by the same method as in 5-4-1.

(5-4-3) Preventing Effect of Printing Plate Surface Smear

The preventing effect of the printing plate surface smear due to printing was evaluated using the printing plate obtained in (4). Process X Cyan (trade name, made by Toyo Ink Mfg. Co., Ltd.) was used as a solvent ink; and an OPP film was used as a matter to be printed. Printing was performed using an Anilox roll of 800 lpi (its cell volume: 3.8 $cm^3/m^2$) and 3M1020 (trade name, made by Sumitomo 3M Ltd.) as a cushion tape, at a printing rate of 100 m/min to thereby print 3,000 m. After the printing, dots on a 3% halftone and 30% halftone and between-dots (concave parts) of the halftone part of the printing plate were observed with a loupe. As a result, a plate in which the ink was adhered only on the upper layer of the dot shoulder was defined as excellent; a plate in which the ink flowed to the middle part of the dot was defined as good; and a plate in which the ink flowed to the bottom between dots was defined as poor.

Example 1

A flexographic printing plate was obtained according to (3) and (4) described above by using 70 parts by mass of the sample (a) obtained in the above as the block copolymer (a), 6 parts by mass of 1,9-nonanediol diacrylate and 3 parts by mass of 1,6-hexanediol dimethacrylate as the photopolymerizable monomers (b), 2.0 parts by mass of 2,2-dimethoxy-phenylacetophenone as the photopolymerization initiator (c), 0.5 part by mass of KF-8010 as the organosilicon compound (d), 13.0 parts by mass of a liquid conjugated butadiene rubber B-2000 (trade name, made by Nippon Soda Co., Ltd., vinyl content: 90 mol %, viscosity at 30° C.: 20 Pa·s) and a liquid conjugated butadiene rubber LIR305 (trade name, made by Kuraray Co., Ltd., its vinyl content: 8 mol %, its viscosity at 30° C.: 40 Pa·s) as plasticizers, and 1.0 part by mass of 2,6-di-t-butyl-p-cresol as a stabilizer.

Example 2

A flexographic printing plate was obtained as in Example 1, except for using X-22-161B as the organosilicon compound (d).

Example 3

A flexographic printing plate was obtained as in Example 1, except for using KF-410 as the organosilicon compound (d).

Example 4

A flexographic printing plate was obtained as in Example 1, except for using SH-710 as the organosilicon compound (d).

Example 5

A flexographic printing plate was obtained as in Example 1, except for using X-22-4272 as the organosilicon compound (d)

Example 6

A flexographic printing plate was obtained as in Example 1, except for using X-22-3710 as the organosilicon compound (d).

Example 7

A flexographic printing plate was obtained as in Example 1, except for using KF-96-100CS as the organosilicon compound (d).

Example 8

A flexographic printing plate was obtained as in Example 1, except for using a styrene-butadiene-styrene block copolymer (hereinafter referred to as SBS), KX-405 (trade name, made by KRATON), as the block copolymer (a).

Example 9

A flexographic printing plate was obtained according to (3) and (4) described above by using 87.5 parts by mass of a styrene-isoprene-styrene copolymer (hereinafter referred to as SIS), D-1161 (trade name, made by KRAYTON), as the block copolymer (a), 6 parts by mass of 1,9-nonanediol diacrylate and 3 parts by mass of 1,6-hexanediol dimethacrylate as the photopolymerizable monomers (b), 2.0 parts by mass of 2,2-dimethoxy-phenylacetophenone as the popolymerization initiator (c), 0.5 part by mass of KF-8010 as the organosilicon compound (d), and 1.0 part by mass of 2,6-di-t-butyl-p-cresol as a stabilizer.

Comparative Example 1

A flexographic printing plate was obtained as in Example 1, except for not using the organosilicon compound (d).

Comparative Example 2

A flexographic printing plate was obtained as in Example 8, except for not using the organosilicon compound (d).

Comparative Example 3

A flexographic printing plate was obtained as in Example 9, except for not using the organosilicon compound (d).

The flexographic printing plates obtained in Examples 1 to 9 and Comparative Examples 1 to 3 had no fine wrinkles on their surface and no problem with their appearance. When the printing plate surfaces of Examples 1 to 9 were rubbed by hand, they had smoother and less resisting feeling than Comparative Example 1. Shore A hardnesses of the printing plates obtained in Examples 1 to 9 were measured under the following conditions. The printing plates were allowed to stand for 1 day in a thermohygrostat chamber of a temperature of 23° C. and a relative humidity of 50%; thereafter, the printing plates were measured using a JIS constant-pressure loader GS-710 (made by TECLOCK Corp., durometer GS-719G; ASTM D2240A, JIS K6253A, ISO 7619A) and a value after a 15 sec-loading (weight: 1 kg) on a solid surface was defined as Shore A hardness. As a result, all of the Shore hardnesses were not less than 50% and not more than 68°.

The evaluation results of the flexographic printing plates obtained in Examples 1 to 9 and Comparative Examples 1 to 3 as shown in Table 1.

It is found that the use of the photosensitive resin compositions obtained in Examples enables to satisfy a high effect of preventing the printing plate surface smear of the printing plates while maintaining the cold flow resistance of the photosensitive resin constructs, the transparency of the photosensitive resin compositions and the image reproducibility of the printing plates, which is the first case for photosensitive resin compositions containing an organosilicon compound.

Above all, the printing plates of Examples using silicone oils containing an organic group containing an amino group or an aralkyl group exhibited a high preventing effect on the printing plate surface smear. Among these, Example 1 using a silicone oil containing an organic group containing an amino group exhibited a comprehensively most favorable result.

TABLE 1

| | Example 1 | Example 2 | Example 3 | Example 4 | Example 5 | Example 6 | Example 7 | Example 8 | Example 9 | Comp. Ex. 1 | Comp. Ex. 2 | Comp. Ex. 3 |
|---|---|---|---|---|---|---|---|---|---|---|---|---|
| Block copolymer (a) | Sample (a) | Sample (a) | Sample (a) | Sample (a) | Sample (a) | Sample (a) | Sample (a) | SBS | SIS | Sample (a) | SBS | SIS |
| Functional group of organosilicon compound (d) | Amino group | Amino group | Methylstyryl group | Phenyl group | Ether group | Carboxyl group | Not-modified | Amino group | Amino group | None | None | None |
| (5-1) Cold flow resistance | 1.5% | 1.8% | 2.8% | 1.5% | 2.9% | 2.9% | 1.5% | 1.8% | 2.0% | 1.5% | 1.8% | 2.0% |
| Evaluation | Excellent | Excellent | Good | Excellent | Good | Good | Excellent | Excellent | Excellent | Excellent | Excellent | Excellent |
| (5-2) Haze of photosensitive resin composition | 13% | 15% | 15% | 11% | 18% | 19% | 20% | 15% | 16% | 12% | 15% | 15% |
| (5-3) Depth (mm) of concave line of 500 mm | 230 | 220 | 190 | 240 | 200 | 205 | 180 | 220 | 210 | 230 | 220 | 220 |
| (5-4-1) Contact angle of water | 94° | 94° | 95° | 88° | 88° | 88° | 88° | 94° | 94° | 85° | 85° | 83° |
| (5-4-2) Contact angle of water (after ethanol-wiping) | 97° | 96° | 95° | 86° | 85° | 85° | 85° | 96° | 95° | 85° | 85° | 83° |
| (5-4-3) Ink repellency | Excellent | Excellent | Excellent | Good | Good | Good | Good | Excellent | Excellent | Poor | Poor | Poor |

INDUSTRIAL APPLICABILITY

The present invention is suitably usable in the field of photosensitive resin compositions for use in flexographic printing plates.

The invention claimed is:

1. A photosensitive resin composition for a solvent-developing or thermally-developing flexographic printing plate, comprising:
   (a) a block copolymer comprising a polymer block having a conjugated diene as a main component and a polymer block having a vinyl aromatic hydrocarbon as a main component;
   (b) a photopolymerizable monomer;
   (c) a photopolymerization initiator; and
   (d) an organosilicon compound;
   wherein the organosilicon compound (d) comprises a silicone oil having a siloxane unit and an amino group;
   wherein the amino group is a primary amino group and is introduced to a side chain or at least one terminal of the silicone oil having a siloxane unit; and
   wherein the organosilicon compound (d) has an amino group equivalent of from 300 g/mol to 1,000 g/mol.

2. The photosensitive resin composition of claim 1, wherein the block copolymer (a) comprises a polymer block having butadiene as a main component and a polymer block having a vinyl aromatic hydrocarbon as a main component.

3. The photosensitive resin composition of claim 1, wherein the photosensitive resin composition has a content of the organosilicon compound (d) in a range from 0.05% by weight to 1.0% by weight.

4. The photosensitive resin composition for a solvent-developing or a thermally-developing flexographic printing plate according to claim 1, wherein the composition comprises 69 to 95% by weight of the component (a), 1 to 20% by weight of the component (b), 0.1 to 10% by weight of the component (c) and 0.05 to 1.0% by weight of the component (d) based on 100% by weight of a sum of the components (a), (b), (c) and (d) in the composition.

5. The photosensitive resin composition according to claim 1, wherein the photosensitive resin composition has a vinyl content of not less than 40 mol% based on a total amount of a liquid conjugated diene rubber contained in the composition.

6. The photosensitive resin composition according to claim 1, wherein the block copolymer (a) comprises an alkylene unit.

7. The photosensitive resin composition according to claim 1, wherein at least one block copolymer (a) contained in the photosensitive resin composition has a number-average molecular weight of more than 200,000.

8. The photosensitive resin composition according to claim 1, wherein at least one photopolymerizable monomer (b) comprises 2 mol of a methacrylate group per one molecule and wherein the photosensitive resin composition comprises not less than 2.0% by weight of the photopolymerizable monomer (b).

9. A photosensitive resin construct for a solvent-developing or thermally-developing flexographic printing plate, the construct comprising a laminated structure comprising:
- a support; and
- a layer of the photosensitive resin composition according to claim 1 molded on a surface of the support.

10. The photosensitive resin construct for a solvent-developing or thermally-developing flexographic printing plate according to claim 9, the construct comprising on the photosensitive resin composition layer an ultraviolet-ray shielding layer which comprises an infrared-ray sensitive substance and which is able to ablate with an infrared laser.

* * * * *